United States Patent
Tsai et al.

(10) Patent No.: US 12,132,036 B2
(45) Date of Patent: Oct. 29, 2024

(54) FAN-OUT LED PACKAGING STRUCTURE AND METHOD

(71) Applicant: SJ SEMICONDUCTOR (JIANGYIN) CORPORATION, Jiangyin (CN)

(72) Inventors: Hanlung Tsai, Jiangyin (CN); Xingtao Xue, Jiangyin (CN); Chengchung Lin, Jiangyin (CN)

(73) Assignee: SJ Semiconductor(Jiangyin) Corporation, Jiangyin (CN)

( * ) Notice: Subject to any disclaimer, the term of this patent is extended or adjusted under 35 U.S.C. 154(b) by 423 days.

(21) Appl. No.: 17/478,832

(22) Filed: Sep. 17, 2021

(65) Prior Publication Data
US 2022/0093580 A1      Mar. 24, 2022

(30) Foreign Application Priority Data

Sep. 18, 2020    (CN) .......................... 2020109865996
Sep. 18, 2020    (CN) .......................... 2020220589170

(51) Int. Cl.
*H01L 25/16*     (2023.01)
*H01L 23/00*     (2006.01)
*H01L 33/54*     (2010.01)
*H01L 33/62*     (2010.01)

(52) U.S. Cl.
CPC ............ *H01L 25/167* (2013.01); *H01L 24/19* (2013.01); *H01L 24/24* (2013.01); *H01L 24/73* (2013.01); *H01L 24/82* (2013.01); *H01L 24/96* (2013.01); *H01L 33/54* (2013.01); *H01L 33/62* (2013.01); *H01L 2224/211* (2013.01); *H01L 2224/24147* (2013.01); *H01L 2224/73209* (2013.01); *H01L 2224/82005* (2013.01); *H01L 2933/005* (2013.01); *H01L 2933/0066* (2013.01)

(58) Field of Classification Search
CPC ... H01L 2224/02379; H01L 2224/0231; H01L 2224/02311; H01L 2224/02331; H01L 2224/06137; H01L 2224/06147; H01L 2224/05548; H01L 2224/05569; H01L 2224/13008; H01L 2224/13024; H01L 25/0657; H01L 25/167; H01L 33/62; H01L 33/64
See application file for complete search history.

*Primary Examiner* — David A Zarneke
(74) *Attorney, Agent, or Firm* — IPRTOP LLC (57) ABSTRACT

The present disclosure provides fan-out LED packaging structures and methods. The fan-out LED packaging structure at least comprises: an LED wafer, a packaging layer, a first redistribution layer, an IC control chip module, and a second redistribution layer. The LED wafer and the IC control chip module use metal wires of the first and second redistribution layers and metal-plated holes of the packaging layer to lead out and to control the LED wafer and the IC control chip. The present disclosure also provides fan-out LED packaging methods. The methods adopt metal plating in place of wire bonding, and adopt PI dielectric layers and rewiring layers in place of a base substrate, thus effectively reducing the LED package size.

5 Claims, 10 Drawing Sheets

FAN-OUT LED PACKAGING STRUCTURE AND METHOD

CROSS REFERENCE TO RELATED APPLICATION

The present application claims the benefit of priority to Chinese Patent Application No. CN 2020109865996, entitled "FAN-OUT LED PACKAGING STRUCTURE AND METHOD", and Chinese Patent Application No. CN 2020220589170, entitled "FAN-OUT LED PACKAGING STRUCTURE", both filed with CNIPA on Sep. 18, 2020, the disclosures of which are incorporated herein by reference in their entirety for all purposes.

FIELD OF TECHNOLOGY

The present disclosure generally relates to LED packaging, in particular, to a fan-out LED packaging structure and method.

BACKGROUND

Liquid crystal displays (LCDs) and RGB light-emitting-diodes (RGBLEDs) are commonly used in large outdoor display screens. Traditional LCDs have the advantage of high resolution, but splicing multiple LCD panels is needed to obtain a large outdoor LCD screen, which often results in large gaps between the panels, affecting the visual effect of the large screen. For consumer electronic screens, the RGBLEDs are preferred because they have better color reproduction and no splicing gaps. However, traditional LEDs require package bodies to have a large package size and large spacing therebetween demanded by heat dissipation, which results in low resolution.

Thus the key to improving the resolution of LED screens is to reduce the package size. Due to the use of bonding wires and base substrates, the traditional LED packaging usually results in a large package size and thickness. As the key to improving the market competitiveness of LED screens, reducing the package size has remained a technical difficulty in the field.

SUMMARY

In a traditional LED packaging method, an LED chip and an IC control chip module are respectively first die-bonded on two sides of a base substrate, and then electrical properties are introduced into the base substrate through bonding wires of the LED chip. The circuits within the substrate are used to communicate with the IC chip module to achieve LED circuit control. A disadvantage of the traditional LED packaging method is that the use of the base substrate and the bonding wires in the packaging structure results in a large package size and thickness, which is not conducive to the improvement of display resolution.

The present disclosure includes: an fan-out LED packaging structure, the fan-out LED packaging structure at least includes an LED wafer which includes a first surface and a second surface, wherein the first surface is plated with electrodes; a packaging layer encloses a lateral side and the first surface of the LED wafer; a first redistribution layer includes a polyimide (PI) dielectric layer and first metal wires embedded in the PI dielectric layer, the first redistribution layer includes a first surface and a second surface opposite to the first surface, the LED wafer is bonded to the second surface of the redistribution layer, the electrodes on the first surface of the LED wafer are connected to the first metal wires of the first redistribution layer by means of perforated metal-plated electrodes disposed in the packaging layer; an IC control chip module includes an IC control chip, metal bumps, a thermally conductive adhesive, and a heat sink; an IC control chip includes a first surface and a second surface opposite to the first surface, herein the first surface includes electrodes, metal bumps formed on the electrodes, thermally conductive adhesive, and a heat sink successively disposed on the second surface; an IC control chip module being mounted to the metal bumps on the second surface of the first redistribution layer, so the IC control chip module is electrically connected to the LED wafer through the first redistribution layer; and a second redistribution layer includes a second PI dielectric layer and second metal wires in the second PI dielectric layer, herein the second metal wires of the second redistribution layer are connected to the second surface of the LED wafer, and also are connected to the first metal wires of the first redistribution layer for leading out and controlling the LED wafer and the IC control chip.

Optionally, the material of the packaging layer includes one of silica gel, polyimide, and epoxy resin.

Optionally, the metal wires include one of copper, gold, and silver wires, the LED metal electrodes include one of copper, gold, and silver electrodes, and the metal bumps include one of a tin solder, a silver solder, and a gold-tin alloy solder.

The present disclosure also provides a fan-out LED packaging method, the method includes steps: 1) providing a support substrate; 2) forming a separation layer on the support substrate; 3) providing an LED wafer including a first surface and a second surface, the first surface being plated with electrodes, and fixing the second surface of the LED wafer to the separation layer such that the electrodes on the first surface of the LED wafer face away from the separation layer; 4) packaging the LED wafer by a packaging layer such that the first surface and the periphery of the LED wafer are enclosed by the packaging layer, the packaging layer at the periphery of the LED wafer being in contact with the separation layer; 5) drilling holes in the packaging layer on the side of the first surface of the LED wafer such that surfaces are exposed at specific portions of the first surface of the LED wafer and on the separation layer; 6) plating to form LED metal electrodes such that surfaces of the packaging layer, exposed portions of the first surface of the LED wafer, and exposed portions of the separation layer are covered by continuous metal materials; 7) forming a first redistribution layer on the packaging layer on the side of the first surface of the LED wafer, the first redistribution layer including a first PI dielectric layer and first metal wires, wherein the first PI dielectric layer and the first metal wires are stacked alternately, the first PI dielectric layer also fills holes formed when drilling the packaging layer, the first metal wires are connected to the LED metal electrodes exposed at the packaging layer; 8) stripping the support substrate from the packaged LED wafer along with the separation layer, to expose the packaging layer, the LED metal electrodes at the drilled locations of the packaging layer, and the second surface of the LED wafer; 9) forming a second redistribution layer on the second surface of the LED wafer, the second redistribution layer including second PI dielectric layer and second metal wires in the second PI dielectric layer, the second metal wires of the second redistribution layer being connected to the first metal wires of the first redistribution layer to lead out the LED wafer and the LED metal electrodes; and 10) surface-mounting an IC control module with a heat sink to the first redistribution layer.

Optionally, the LED wafer is packaged with the packaging layer by one of compression molding, transfer molding, liquid seal molding, vacuum lamination, and spin coating.

Optionally, the separation layer includes a light-to-heat conversion layer.

Optionally, the support substrate includes one of a glass substrate, a metal substrate, a semiconductor substrate, a polymer substrate, and a ceramic substrate.

Optionally, step 7) includes: 7-1) placing a PI dry film with a release film on the packaging layer on the first surface of the LED wafer; 7-2) performing vacuum hot pressing so that the PI film shrinks to fit the packaging layer and fills the holes at the drilled locations, and peeling off the release film; and 7-3) performing lithographic resist exposure and development to expose metal materials at specific portions of the surface of the packaging layer.

The present disclosure also provides a fan-out packaging structure, including: an IC control wafer module, the IC control wafer module including an IC control wafer, the IC control wafer including a first surface and a second surface, the first surface having electrodes with copper lead posts formed thereon, the first surface having PI dielectric materials that packages the electrodes and the metal lead posts, with top surfaces of the metal lead posts being exposed; a first packaging layer enclosing the periphery of the IC control wafer module, wherein a thermally conductive adhesive and a heat sink are successively mounted to the second surface of the IC control wafer; a first redistribution layer including a first PI dielectric layer and first metal wires in the first PI dielectric layer, the first redistribution layer including a first surface and an opposite second surface, wherein the first metal wires run through the first surface and the second surface; the first metal wires are provided on the surface of the second surface, and tall copper posts are formed on the metal wires on the surface of the second surface; the IC control wafer module is tightly attached to the first surface of the first redistribution layer; and the metal lead posts of the IC control wafer module are connected to the first metal wires exposed on the first surface of the first redistribution layer; an LED wafer module, the LED wafer module including an LED control wafer, the LED control wafer including a first surface and a second surface, the first surface having electrodes, the second surface having PI dielectric materials that packages the electrodes and metal lead posts, with top surfaces of the metal lead posts being exposed; a second packaging layer enclosing the periphery of the LED wafer module and the periphery of the tall copper posts, wherein the first surface of the LED wafer is tightly attached to the second surface of the first redistribution layer; the electrodes on the first surface of the LED wafer are coupled with the first metal wires exposed on the second surface of the first redistribution layer and are connected to the IC control wafer module via the first metal wires; and the electrodes on the first surface of the LED wafer are not coupled with the first metal wires on the second surface of the first redistribution layer; and a second redistribution layer including a second PI dielectric layer and second metal wires in the second PI dielectric layer, the second redistribution layer being formed on the second surface of the LED wafer, wherein the second metal wires connect the metal lead posts on the second surface of the LED wafer and the tall copper posts in the second packaging layer, and lead out the IC wafer module through the tall copper posts and the first metal wires of the first redistribution layer; and the second metal wires on the surface of the second redistribution layer are configured for Surface Mounted Devices (SMDs).

The present disclosure also provides a fan-out LED packaging method, the packaging method including steps of: 1) providing a support substrate; 2) forming a separation layer on the support substrate; 3) providing an IC control wafer module including an IC control wafer, the IC control wafer including a first surface and a second surface, the first surface being provided with packaged electrodes and metal lead posts, and die-bonding the second surface of the IC control wafer to the separation layer such that the electrodes on the first surface of the IC control wafer face away from the separation layer; 4) packaging the IC control wafer module with a first packaging layer, such that the periphery and the surface facing away from the separation layer of the IC control wafer module are enclosed by the first packaging layer, the first packaging layer at the periphery of the IC control wafer module being in contact with the separation layer; 5) grinding the first packaging layer on the first surface of the IC control wafer such that the metal lead posts on the first surface of the IC control wafer module are exposed; 6) forming a first redistribution layer on the surface being ground in step 5), the first redistribution layer including alternately stacked patterned first PI dielectric layer and patterned first metal wires, the first metal wires being connected to the metal lead posts on the first surface of the IC control wafer module; 7) forming tall copper posts at specific portions of the first metal wires of the first redistribution layer to lead out the IC control wafer module; 8) providing an LED wafer module including an LED wafer, the LED wafer including a first surface and a second surface, the first surface being provided with electrodes, the second surface being provided with packaged metal lead posts, and die-bonding the first surface of the LED wafer to the first redistribution layer such that the electrodes on the first surface are connected to the first metal wires of the first redistribution layer, and the metal lead posts on the second surface of the LED wafer face away from the first redistribution layer; (9) packaging the first redistribution layer, the LED wafer module and the tall copper posts with a second packaging layer; 10) grinding the second packaging layer such that the metal lead posts on the first surface of the LED wafer and the tall copper posts on the first redistribution layer are exposed; 11) forming a second redistribution layer on the face being ground in step 10), the second redistribution layer including alternately stacked patterned second PI dielectric layer and patterned second metal wires, the second metal wires being connected to the metal lead posts on the first surface of the LED wafer and top surfaces of the tall copper posts on the first redistribution layer; 12) stripping the support substrate along with the separation layer to expose the second surface of the IC control wafer; 13) applying a thermally conductive adhesive on the second surface of the IC control wafer; 14) mounting a heat sink on the thermally conductive adhesive; and 15) performing wafer cutting to obtain the final fan-out LED packaging structure.

As described above, the fan-out LED packaging structure and method of the present disclosure have the following beneficial effect: by adopting the fan-out packaging method, using the metal plating in place of wire bonding, and using the PI dielectric layers and rewiring layers in place of a base substrate, the package size is effectively reduced.

BRIEF DESCRIPTION OF THE DRAWINGS

FIGS. 17-32 show intermediate structures obtained after various steps of another fan-out LED packaging method of the present disclosure, wherein FIG. 32 shows a schematic diagram of the other fan-out LED packaging structure of the present disclosure.

DETAILED DESCRIPTION

Embodiments of the present disclosure will be described below with specific examples, and other advantages and effects of the present disclosure may be easily understood by those skilled in the art from the disclosure in the specification. The present disclosure may also be carried out or applied in other embodiments, and various modifications or changes may also be made to the details in the specification based on different ideas and applications without departing from the spirit of the present disclosure.

As in the detailed description of the embodiments of the present disclosure, for convenience of description, cross-sectional views illustrating device structures are partially enlarged not necessarily to scale, and the schematic diagrams are only examples, which should not limit the scope of the present disclosure herein. In addition, length, width and depth three-dimensional space sizes should be considered in the actual fabrication.

For ease of description, spatial relationship terms such as "beneath", "below", "lower than", "under", "above", and "on" may be used herein to describe a relationship between one element or feature and other elements or features shown in the drawings. It will be appreciated that these spatial relationship terms are intended to encompass directions of a device in use or operation other than directions depicted in the drawings. In addition, when a layer is referred to as being "between" two layers, it may be the only layer between the two layers, or there may be one or more layers therebetween.

Referring to FIGS. 1-32, it is to be noted that drawings provided in the embodiments only schematically illustrate the basic idea of the present disclosure, so the drawings only show components related to the present disclosure, and are not drawn according to the numbers, shapes and sizes of the components in actual implementation; the forms, numbers and proportions of the components in actual implementation may be adjusted as needed; and the layout of the components may be more complex.

Figure 1:
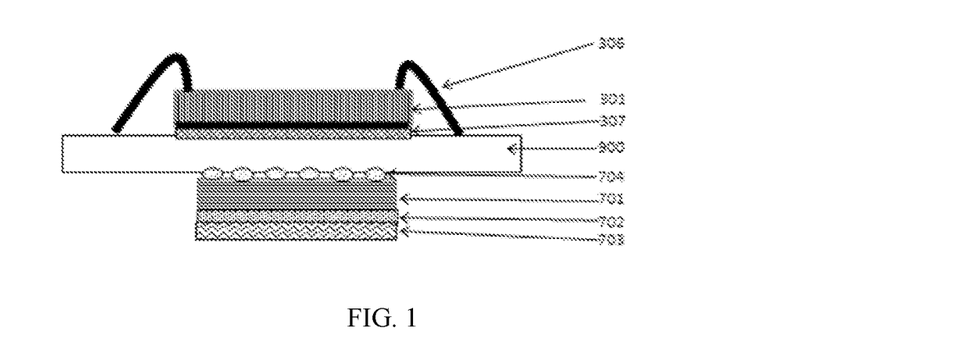
FIG. 1 is a schematic diagram of a conventional packaging structure.

A schematic diagram of a conventional packaging structure is shown in FIG. 1. An LED wafer 301 is die-bonded to one side of a base substrate 900 through an adhesive 307, and electrical elements are introduced to the base substrate 900 through bonding wires 306; an IC control wafer 701 is die-bonded to the other side of the base substrate 900, and is connected to circuitry inside the base substrate 900 and coupled with the LED wafer 301 through metal bumps 704 to achieve LED circuit control; and a thermally conductive adhesive 702 and a heat sink 703 are successively mounted to a side of the IC control wafer 701 facing away from the base substrate 900. A disadvantage of such a structure is that the use of the base substrate and the outer bonding wires in the packaging structure results in a large package size and thickness, which is not conducive to the improvement of display resolution.

Embodiment 1

As shown in FIGS. 2-16, the present disclosure provides a fan-out LED packaging method, the packaging method includes the steps described below.

Figure 2:
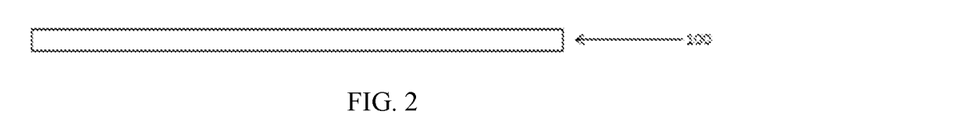
FIGS. 2-16 show intermediate structures obtained after various steps of a fan-out LED packaging method of the present disclosure, wherein FIG. 16 also shows a schematic diagram of a fan-out LED packaging structure of the present disclosure.

As shown in FIG. 2, step 1) is performed first. A support substrate 100 is provided. The support substrate includes one of a glass substrate, a metal substrate, a semiconductor substrate, a polymer substrate, and a ceramic substrate.

Figure 3:
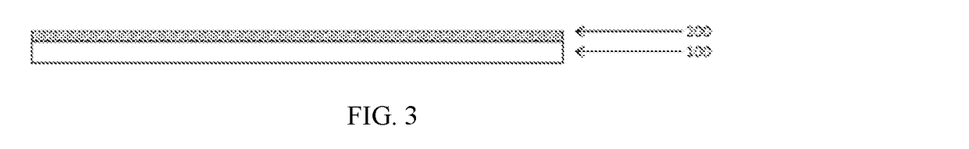

As shown in FIG. 3, next, step 2) is performed. A separation layer 200 is formed on the support substrate. The separation layer includes a light-to-heat conversion layer, which is formed on the support substrate by a spin coating process and then cured by a curing process. The light-to-heat conversion layer has stable properties and a smooth surface, and is easy to peel off in a subsequent stripping process.

Figure 4:
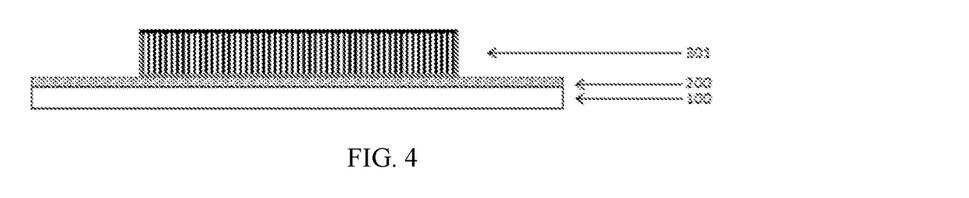

As shown in FIG. 4, then the method proceeds to step 3). An LED wafer 301 is provided, which includes a first surface and a second surface, the first surface being plated with electrodes. The electrodes may be copper electrodes, gold electrodes or silver electrodes. The second surface of the LED wafer is fixed to the separation layer 200 such that the electrodes on the first surface of the LED wafer face away from the separation layer 200.

Figure 5:
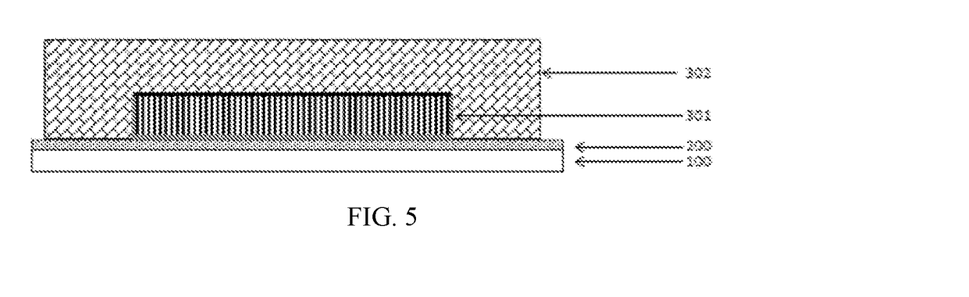

As shown in FIG. 5, then the method proceeds to step 4). The LED wafer 301 is packaged by a packaging layer 302 such that the first surface and the periphery of the LED wafer 301 are enclosed by the packaging layer, herein the packaging layer 302 at the periphery of the LED wafer 301 is in contact with the separation layer 200. The material of the packaging layer includes one of silica gel, polyimide, and epoxy resin. The LED wafer is packaged with the packaging layer by one of compression molding, transfer molding, liquid seal molding, vacuum lamination, and spin coating.

Figure 6:
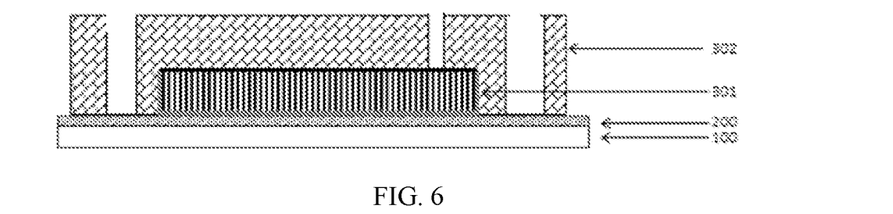

As shown in FIG. 6, then the method proceeds to step 5). Laser drilling is performed on the packaging layer 302 on the first surface of the LED wafer 301 such that specific portions of the first surface of the LED wafer 301 and on the separation layer 200 are exposed.

Figure 7:
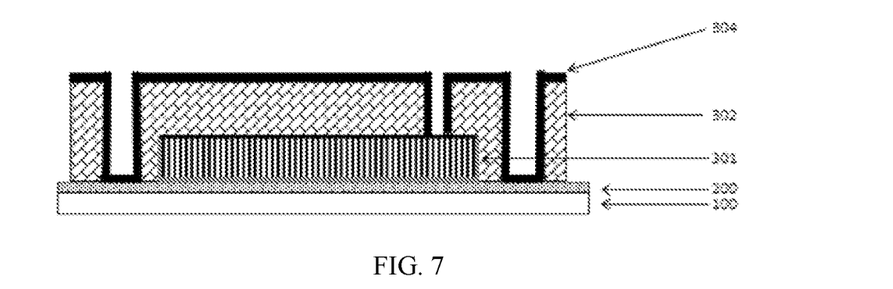

As shown in FIG. 7, then the method proceeds to step 6). LED metal electrodes 304 are plated such that the surface of the packaging layer 302, the exposed portions on the first surface of the LED wafer 301, and the exposed portions on the separation layer 200 are covered by continuous metal materials. The LED metal electrodes 304 include one of copper electrodes, gold electrodes, and silver electrodes.

Figure 8:
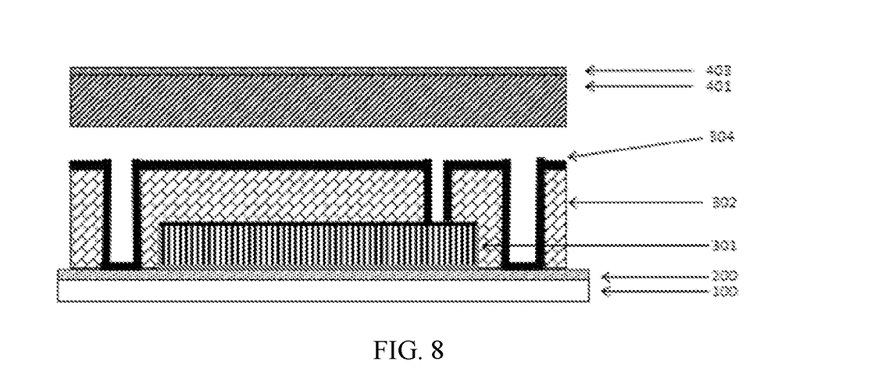
Figure 9:
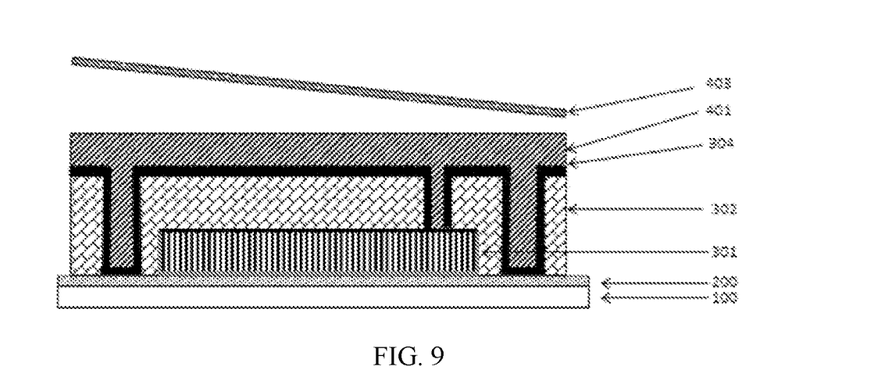
Figure 10:
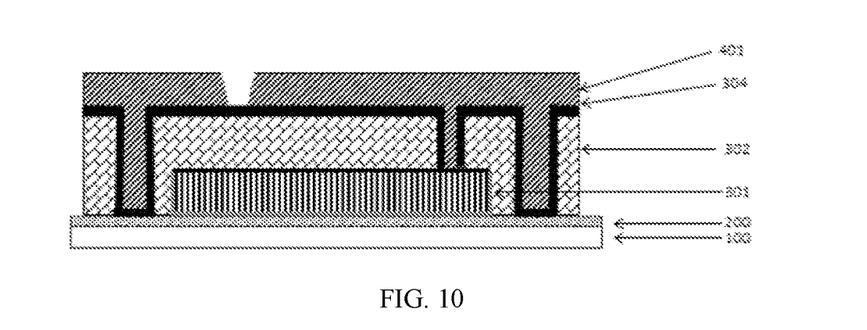

As shown in FIGS. 8 to 10, then the method proceeds to step 7. A first PI dielectric layer 401 is formed on the packaging layer on the first surface of the LED wafer 301, and the holes at the laser drilled locations of the packaging layer are filled, and lithographic resist exposure and development are performed to expose metal at the specific locations of the packaging layer. As shown in FIG. 8, a PI dry film 401 with a release film 403 is placed on the packaging layer 302 on the side of the first surface of the LED wafer 301. As shown in FIG. 9, vacuum hot pressing is performed so that the PI film 401 is fit to the packaging layer 302 and fills the holes at the laser drilled locations, and the release film 403 is peeled off. As shown in FIG. 10, lithographic resist exposure and development are performed to expose metal at the specific locations of the packaging layer 304.

Figure 11:
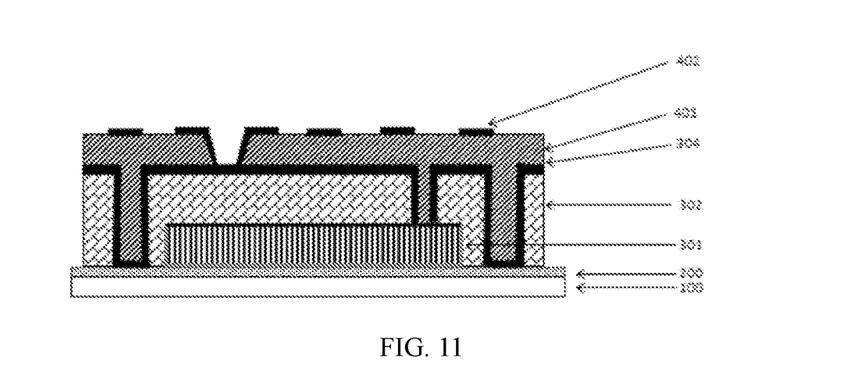

As shown in FIG. 11, then the method proceeds to step 8). A first metal wiring layer 402 is formed on the first PI dielectric layer (PI dry film) 401 by lithographic resist exposure, development, plating and etching process. The first PI dielectric layer 401 and the first metal wires 402 are stacked alternately (the repeating structures are not shown in the figures), and the first PI dielectric layer 401 and the first metal wires 402 form a first redistribution layer. The first metal wires 402 are connected to the substrates LED metal electrodes 304 exposed at the packaging layer 302. The metal wires 402 include one of copper wires, gold wires, or silver wires.

Figure 12:
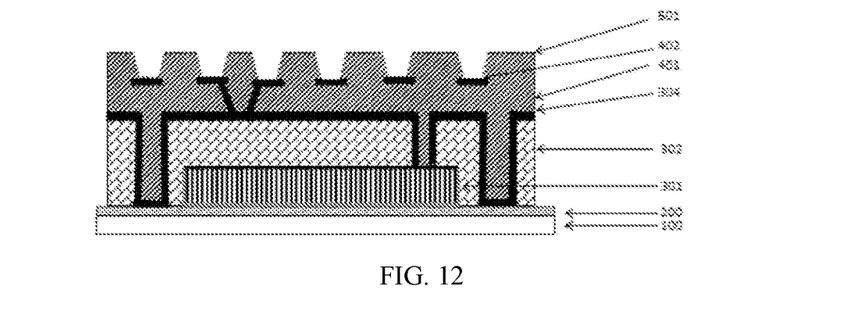

As shown in FIG. 12, then the method proceeds to step 9). PI dielectric material 501 is disposed on the first redistribution layer, and lithographic resist exposure and development are performed to expose the metal wires 402 on the first redistribution layer.

Figure 13:
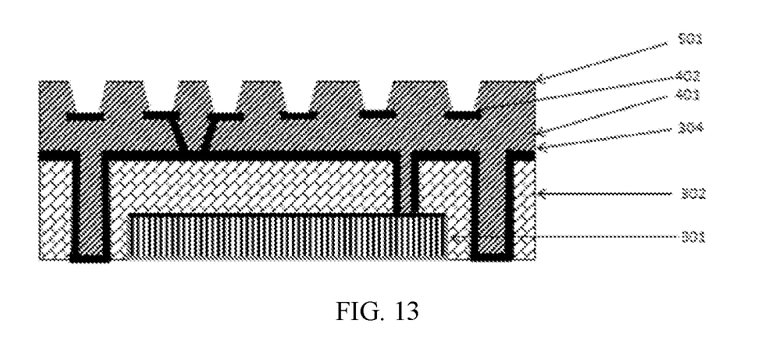

As shown in FIG. 13, then the method proceeds to step 10). The support substrate 100 is peeled off from the packaged LED wafer 301, along with the separation layer 200, to expose the packaging layer 302, the LED metal electrodes 304 at the drilled locations of the packaging layer, and the second surface of the LED wafer 301.

Figure 14:
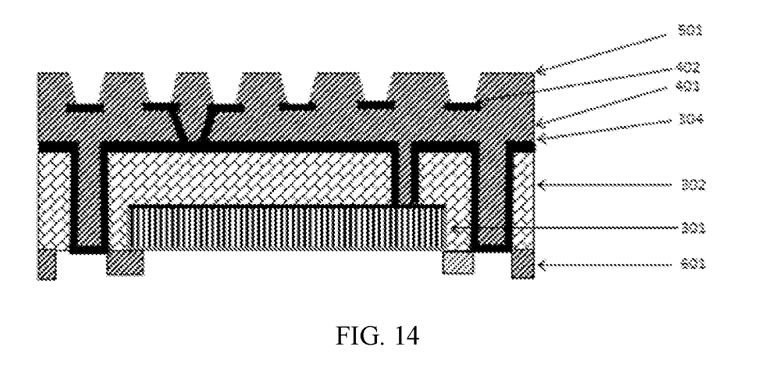
Figure 15:
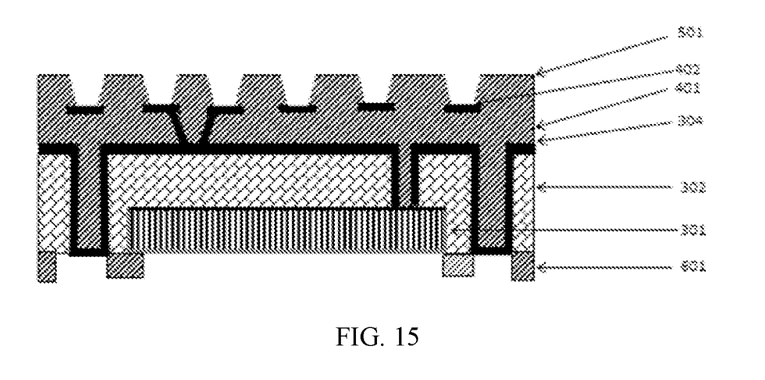

As shown in FIGS. 14-15, then the method proceeds to steps 11). A second redistribution layer is formed on the side of the second surface of the LED wafer, wherein the second redistribution layer includes a second PI dielectric layer 601 and second metal wires 602 in the second PI dielectric layer, the second metal wires of the second redistribution layer 602 is connected to the first metal wires 402 of the first redistribution layer to lead out the LED wafer 301 and the LED metal electrodes 304.

Figure 16:
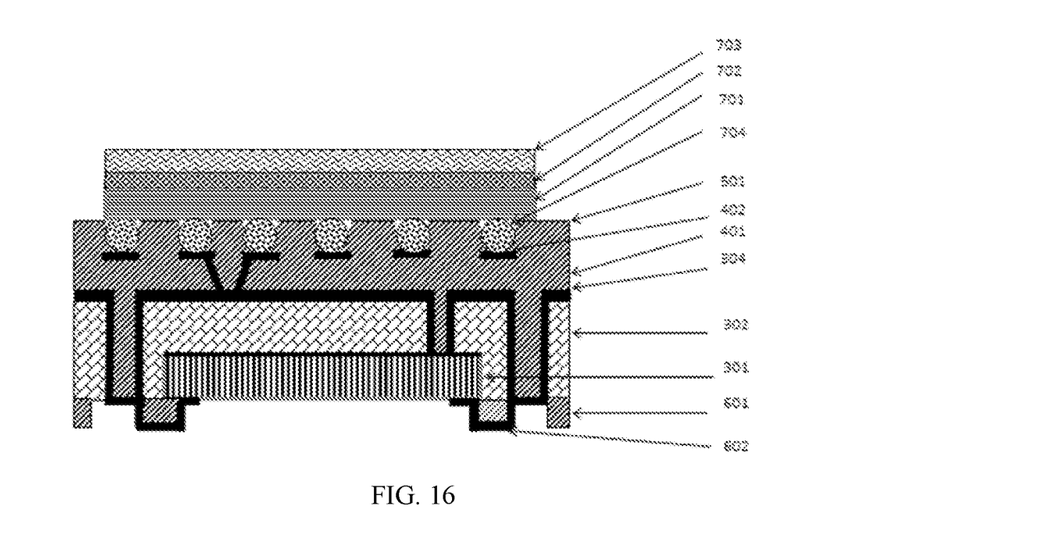

As shown in FIG. 16, then the method proceeds to step 12). An IC control module with a heat sink is surface mounted to the first redistribution layer.

As shown in FIG. 16, the present disclosure also provides a fan-out LED packaging structure including: an LED wafer 301 which has a first surface and a second surface, herein the first surface is pattern-plated with LED metal electrodes, the LED metal electrodes include one of copper electrodes, gold electrodes, and silver electrodes; a packaging layer 302 which encloses a lateral side and the first surface of the LED wafer, herein the material of the packaging layer includes one of silica gel, polyimide, and epoxy resin; a first redistribution layer includes the first PI dielectric layer 401 and the first metal wires 402 in the first PI dielectric layer, the first redistribution layer 402 includes a first surface and a second surface opposite of the first surface, herein the LED wafer 301 is bonded to the second surface of the redistribution layer, the electrodes on the first surface of the LED wafer 301 is connected to the first metal wires 402 of the first redistribution layer, a layer of perforated metal-plated electrodes 304 is disposed in the packaging layer 302; an IC control chip module includes an IC control chip 701, metal bumps 704, a thermally conductive adhesive 702, and a heat sink 703. Herein the IC control chip 701 includes a first surface and an opposite second surface, the first surface contains electrodes, the metal bumps 704 are formed on the electrodes of the first surface, the metal bumps include one of a tin solder, a silver solder, and a gold-tin alloy solder, the thermally conductive adhesive 702 and the heat sink 703 are successively disposed on the second surface. Herein the IC control chip module is mounted to the second surface of the first redistribution layer via metal bumps 704 to electrically connect the LED wafer to the IC control chip module through the metal wires 402 of the first redistribution layer. The thermally conductive adhesive includes one of an organosilicone-based thermally conductive adhesive, an epoxy-based thermally conductive adhesive, a polyurethane-based thermally conductive adhesive, and a PI-based thermally conductive adhesive; and a second redistribution layer which includes a second PI dielectric layer 601 and second metal wires 602 in the second PI dielectric layer, the second redistribution layer is formed on the second surface of the LED wafer, with the second metal wires 602 of the second redistribution layer is electrically connecting to the first metal wires 402 of the first redistribution layer to lead out and control the LED wafer 301 and the IC control chip 701.

Embodiment 2

Figure 17:
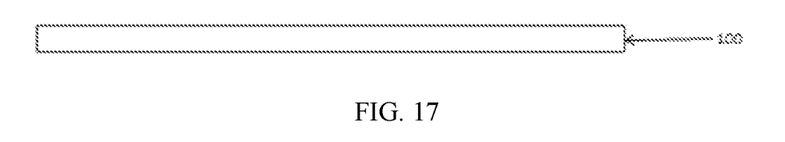

As shown in FIGS. 17-32, another fan-out LED packaging method according to the present disclosure is provided, the packaging method includes the following steps:

As shown in FIG. 17, step 1) is performed first. A support substrate 100 is provided. The support substrate may be one of a glass substrate, a metal substrate, a semiconductor substrate, a polymer substrate, and a ceramic substrate.

Figure 18:
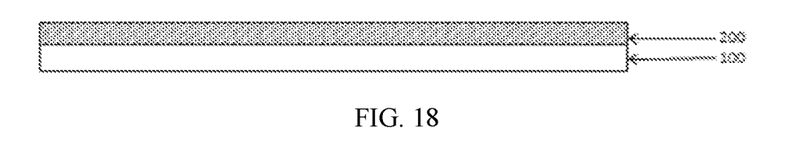

As shown in FIG. 18, then it proceeds to step 2). A separation layer 200 is formed on the support substrate. The separation layer includes a light-to-heat conversion layer, which is formed on the support substrate by a spin coating process and then cured by a curing process.

Figure 19:
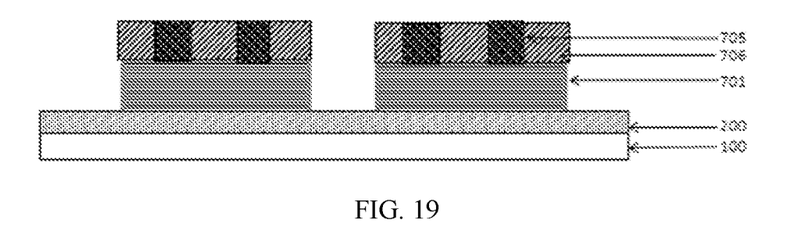

As shown in FIG. 19, then it proceeds to step 3). An IC control wafer module is provided. The module includes an IC control wafer 701, the IC control wafer 701 including a first surface and a second surface, the first surface being provided with electrodes and metal lead posts 705 packaged by PI dielectric materials 706. The second surface of the IC control wafer 701 is die-bonded to the separation layer 200 such that the electrodes on the first surface of the IC control wafer 701 face away from the separation layer 200. The chip electrodes include one of copper electrodes, gold electrodes, and silver electrodes.

Figure 20:
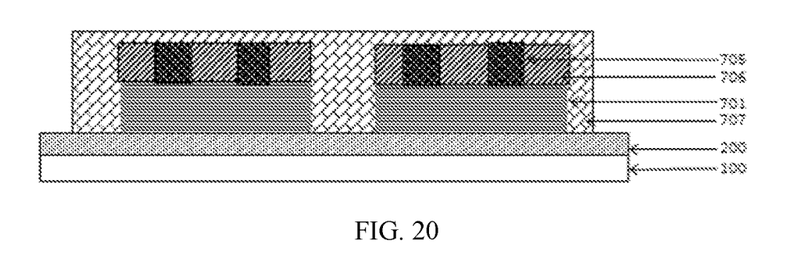

As shown in FIG. 20, then it proceeds to step 4). The IC control wafer module is packaged by a first packaging layer 707, such that the periphery and the surface of the IC control wafer module facing away from the separation layer are enclosed by the first packaging layer 707, the first packaging layer 707 at the periphery of the IC control wafer module being in contact with the separation layer 200. The material of the packaging layer includes one of silica gel, polyimide and epoxy resin.

Figure 21:
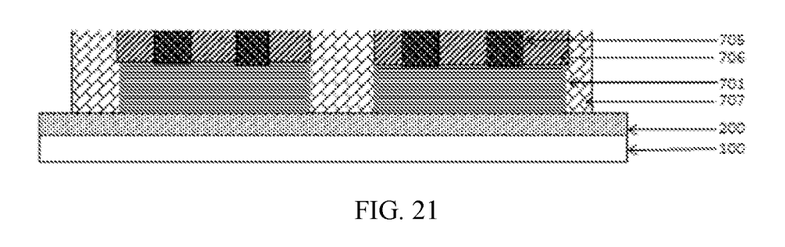

As shown in FIG. 21, then it proceeds to step 5). The first packaging layer 707 on the first surface of the IC control wafer module is ground such that the top surfaces of the metal lead posts 705 on the first surface of the IC control wafer module are exposed.

Figure 22:
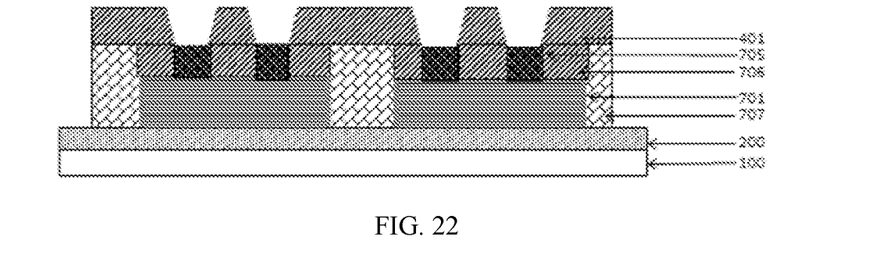
Figure 23:
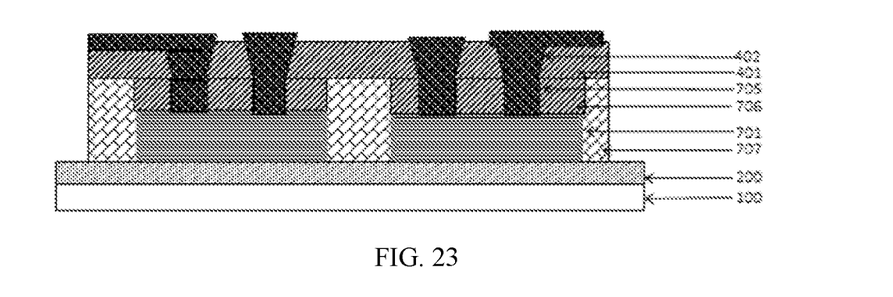

As shown in FIGS. 22-23, then it proceeds to step 6). A first redistribution layer is disposed on the surface which were ground, herein the first redistribution layer includes a first PI dielectric layer 401 and the first metal wires 402 formed by lithographic resist exposure and development, plating and etching process. The first metal wires 402 are connected to the metal lead posts 706 on the first surface of the IC control wafer 701.

Figure 24:
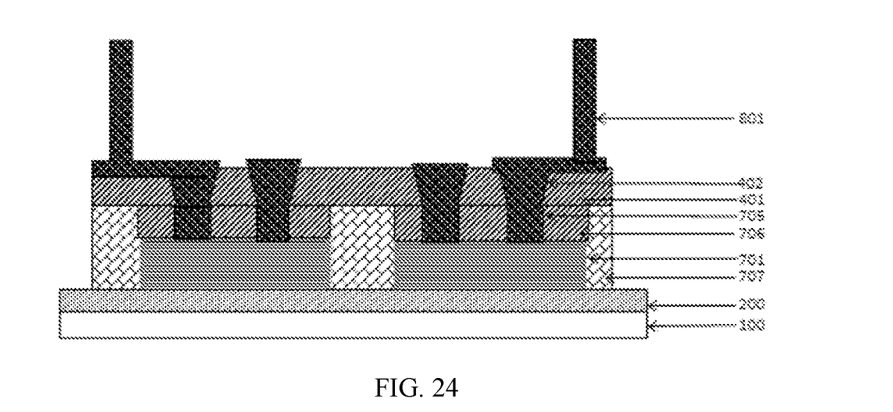

As shown in FIG. 24, then it proceeds to step 7). Tall copper posts 801 are formed at specific portions of the first metal wires of the first redistribution layer to lead out electrical properties of the IC control wafer module. In one embodiment, the tall copper posts may be formed by spot soldering or reflow soldering.

Figure 25:
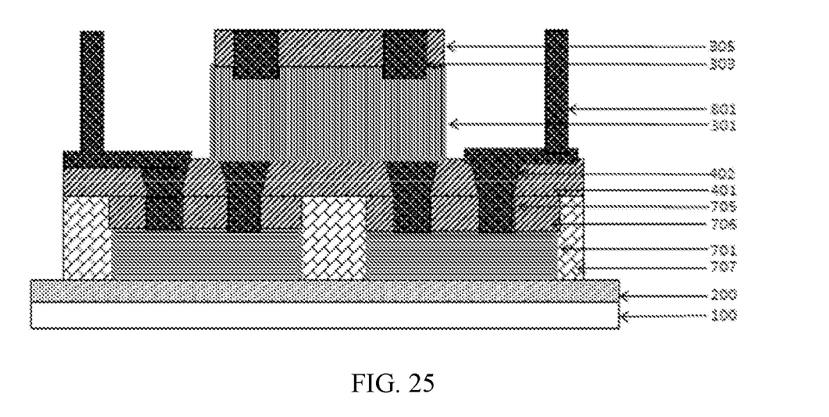

As shown in FIG. 25, it proceeds to step 8). An LED wafer module is provided. The module includes an LED wafer 301, which includes a first surface and a second surface, the first surface is provided with electrodes, the second surface is provided with metal lead posts 303 packaged by PI dielectric materials 305. The first surface of the LED wafer 301 are die-bonded to the first redistribution layer such that the electrodes on the first surface of the LED wafer 301 are connected to the first metal wires 402 of the first redistribution layer, and the metal lead posts 303 on the second surface of the LED wafer module face away from the first redistribution layer.

Figure 26:
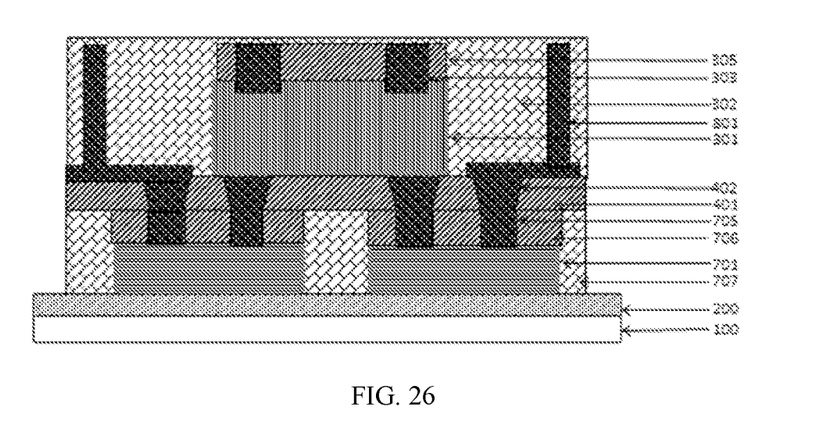

As shown in FIG. 26, then it proceeds to step 9). The first redistribution layer, the LED wafer module and the tall copper posts 801 are packaged by a second packaging layer 302.

Figure 27:
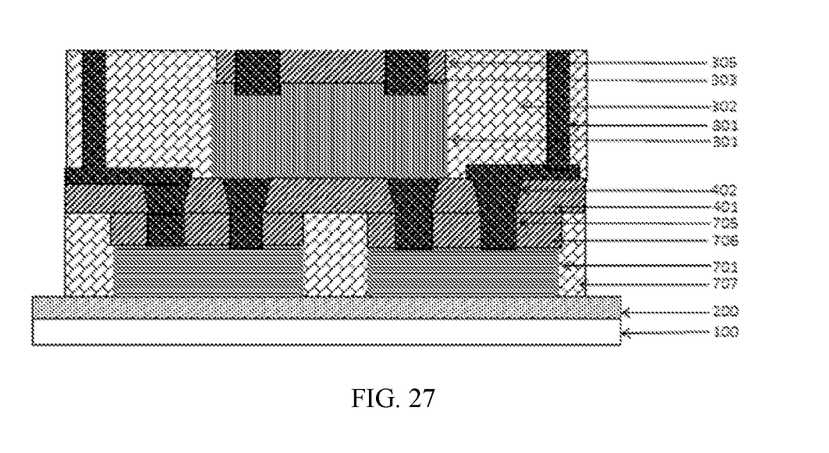

As shown in FIG. 27, then it proceeds to step 10). The second packaging layer 302 is ground such that the metal lead posts 303 on the first surface of the LED wafer 301 and the tall copper posts 801 on the first redistribution layer are exposed.

Figure 28:
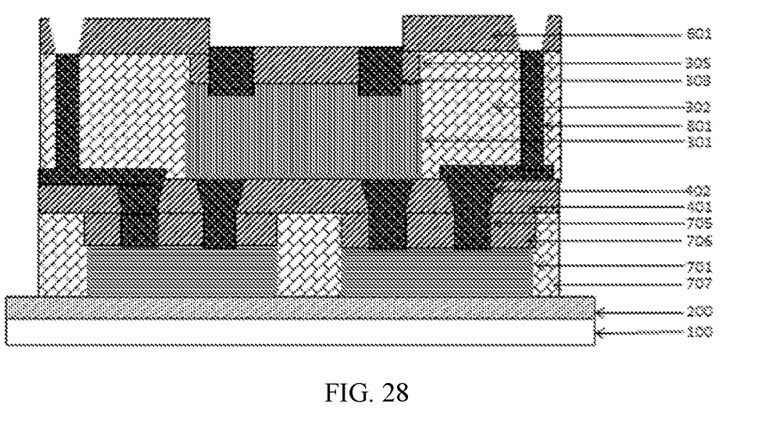
Figure 29:
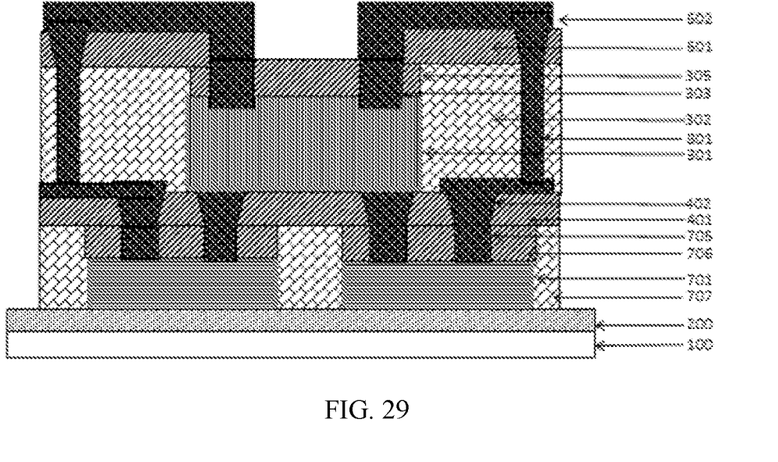

As shown in FIGS. 28-29, it proceeds to step 11). A second redistribution layer is formed on the face which was ground, the second redistribution layer including a second PI dielectric layer 601 formed by lithographic resist exposure and development and second metal wires 602 formed by an exposure, development, plating and etching process, the second metal wires 602 being connected to the metal lead posts 303 on the first surface of the LED wafer 301 and the tall copper posts 801 on the first redistribution layer.

Figure 30:
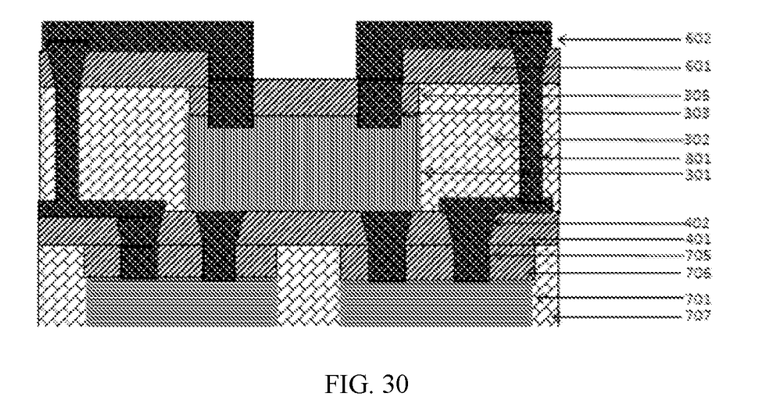

As shown in FIG. 30, then it proceeds to step 12). The support substrate 100 is peeled off along with the separation layer 200 to expose the second surface of the IC control wafer 701.

Figure 31:
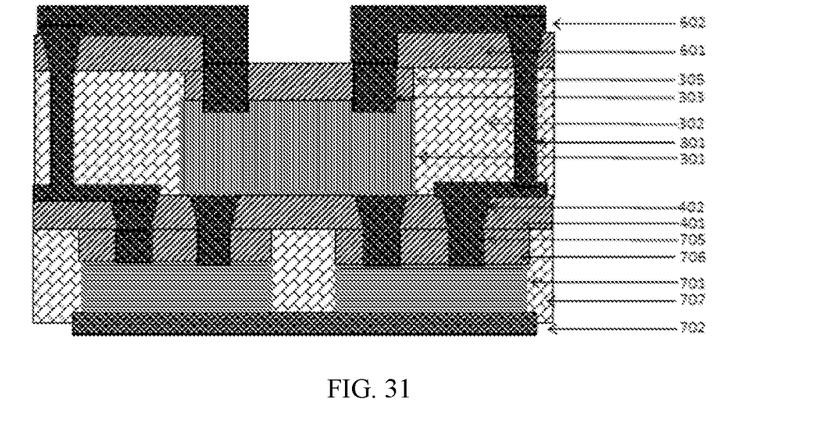

As shown in FIG. 31, then it proceeds to step 13). A thermally conductive adhesive 702 is applied on the second surface of the IC control wafer 701.

Figure 32:
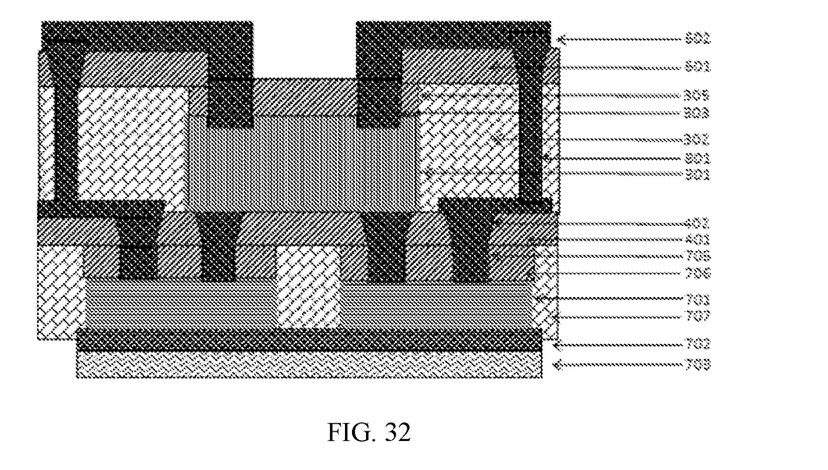

As shown in FIG. 32, then it proceeds to step 14). A heat sink 703 is mounted to the thermally conductive adhesive 702, and wafer cutting is performed to obtain the final fan-out LED packaging structure.

As shown in FIG. 32, the present disclosure also provides a fan-out LED packaging structure, the packaging structure including: an IC control wafer module, the IC control wafer module includes an IC control wafer 701, the IC control wafer 701 includes a first surface and a second surface, the first surface has electrodes with copper lead posts 705 formed thereon, the first surface also has PI dielectric materials 706 that packages the electrodes and the metal lead posts 705, herein the top surfaces of the metal lead posts 705 are exposed; a first packaging layer 707 encloses the periphery of the IC control wafer module, wherein a thermally conductive adhesive 702 and a heat sink 703 are successively mounted to the second surface of the IC control wafer 701, herein the thermally conductive adhesive includes one of an organosilicone-based thermally conductive adhesive, an epoxy-based thermally conductive adhesive, a polyurethane-based thermally conductive adhesive, and a PI-based thermally conductive adhesive; a first redistribution layer includes a first PI dielectric layer 401 and first metal wires 402 in the first PI dielectric layer, the first redistribution layer includes a first surface and an opposite second surface, wherein the first metal wires 402 run through the first surface and the second surface; the metal wires 402 are provided on the surface of the second surface, and tall copper posts 801 are formed on the first metal wires 402 on the surface of the second surface; the IC control wafer module is tightly attached to the first surface of the first redistribution layer; and the metal lead posts 705 of the IC control wafer module are connected to the first metal wires 402 exposed on the first surface of the first redistribution layer; an LED wafer module, the LED wafer module includes an LED control wafer 301, the LED control wafer 301 includes a first surface and a second surface, the first surface having electrodes, the first surface having PI dielectric materials 305 that packages the electrodes and metal lead posts 303, with top surfaces of the metal lead posts 303 being exposed; a second packaging layer enclosing the periphery of the LED wafer module and the periphery of the tall copper posts 801, wherein the first surface of the LED wafer 301 is tightly attached to the second surface of the first redistribution layer; the electrodes on the first surface of the LED wafer 301 are coupled with the first metal wires 402 exposed on the second surface of the first redistribution layer and are connected to the IC control wafer module via the first metal wires 402; and the electrodes on the first surface of the LED wafer 301 are not electrically connected to the metal wires 402 on the second surface of the first redistribution layer; and a second redistribution layer including a second PI dielectric layer 601 and second metal wires 602 in the second PI dielectric layer, the second redistribution layer being formed on the second surface of the LED wafer 301, wherein the second metal wires 602 connect the metal lead posts 305 on the second surface of the LED wafer 301 and the tall copper posts 801 in the second packaging layer, and lead out the IC wafer module through the tall copper posts 801 and the through metal wires 402 of the first redistribution layer; and the second metal wires 602 on the surface of the second redistribution layer are configured for surface mounting of SMDs.

In summary, in the present disclosure, the fan-out packaging method is used for LED packaging, metal plating is used in place of wire bonding, and the PI dielectric layers and wirings are used in place of a base substrate, which effectively reduces the LED package size, thus improving the display resolution.

The above embodiments are merely illustrative of the principles of the present disclosure and effects thereof, and are not intended to limit the present disclosure. Any person skilled in the art can modify or change the above embodiments without departing from the spirit and scope of the present disclosure. Therefore, all equivalent modifications or changes made by those with general knowledge in the technical field without departing from the spirit and technical ideas disclosed in the present disclosure are still covered by the claims of the present disclosure.

What is claimed is:

1. A method of packaging a fan-out LED device, comprising steps of:
   1) providing a support substrate;
   2) forming a separation layer on the support substrate;
   3) providing an LED wafer comprising a first surface and a second surface, wherein the first surface is plated with LED electrodes, and the second surface is attached to the separation layer such that the LED electrodes on the first surface of the LED wafer face away from the separation layer;
   4) packaging the LED wafer with a packaging layer such that the first surface and a periphery of the LED wafer are enclosed by the packaging layer, wherein the packaging layer at the periphery of the LED wafer is in contact with the separation layer;
   5) drilling holes in the packaging layer, wherein the holes expose portions of the first surface of the LED wafer and a surface of the separation layer;
   6) plating LED electrodes in the holes such that a surface of the packaging layer, the exposed portions of the first surface of the LED wafer, and the exposed surface of the separation layer are covered by a continuous metal material;

7) forming a first redistribution layer on the packaging layer on the first surface of the LED wafer, wherein the first redistribution layer comprises a first PI dielectric layer and first metal wires, wherein the first PI dielectric layer and the first metal wires are stacked alternately, wherein the first PI dielectric layer also fills the holes at drilled locations of the packaging layer, wherein the first metal wires are connected to the LED electrodes exposed from the packaging layer;

8) peeling the support substrate off the packaged LED wafer, along with the separation layer, to expose the packaging layer, the LED electrodes at the drilled locations of the packaging layer, and the second surface of the LED wafer;

9) forming a second redistribution layer on the second surface of the LED wafer, wherein the second redistribution layer comprises a second PI dielectric layer and second metal wires disposed in the second PI dielectric layer, wherein the second metal wires of the second redistribution layer are connected to the first metal wires of the first redistribution layer to lead out the LED wafer and the LED electrodes; and 10) surface mounting an IC control module with a heat sink to the first redistribution layer.

2. The method according to claim 1, wherein the LED wafer is packaged with the packaging layer by one of compression molding, transfer molding, liquid seal molding, vacuum lamination, and spin coating.

3. The method according to claim 1, wherein the support substrate comprises one of a glass substrate, a metal substrate, a semiconductor substrate, a polymer substrate, and a ceramic substrate.

4. The method according to claim 1, wherein the separation layer comprises a light-to-heat conversion layer.

5. The method according to claim 1, wherein step 7) further comprises:

7-1) placing a PI dry film with a release film on the packaging layer on the side of the first surface of the LED wafer;

7-2) performing vacuum hot pressing so that the PI dry film is attached to the packaging layer and also fills the drilled holes, and peeling off the release film; and 7-3) performing lithographic resist exposure and development to expose metal at the portions of the packaging layer.

* * * * *